United States Patent
Phillips

(10) Patent No.: US 8,750,551 B2
(45) Date of Patent: *Jun. 10, 2014

(54) SHIELDED MICROPHONE FOR MOBILE COMMUNICATIONS DEVICE

(75) Inventor: Robert W. Phillips, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/479,343

(22) Filed: May 24, 2012

(65) Prior Publication Data

US 2012/0237071 A1    Sep. 20, 2012

Related U.S. Application Data

(63) Continuation of application No. 11/399,497, filed on Apr. 7, 2006, now Pat. No. 8,213,660.

(51) Int. Cl.
*H04R 9/08* (2006.01)

(52) U.S. Cl.
USPC .......... 381/365; 381/355; 381/360; 381/361; 381/368; 361/769; 361/809; 361/812

(58) Field of Classification Search
USPC .............. 381/355–368; 361/769, 809, 812
See application file for complete search history.

(56) References Cited

U.S. PATENT DOCUMENTS

| | | | | |
|---|---|---|---|---|
| 3,306,990 | A * | 2/1967 | Walker | 381/365 |
| 4,038,500 | A * | 7/1977 | Frye | 381/361 |
| 5,097,515 | A * | 3/1992 | Baba | 381/191 |
| 5,937,361 | A | 8/1999 | Smith | |
| 6,128,385 | A * | 10/2000 | Goyal et al. | 379/433.01 |
| 6,188,773 | B1 * | 2/2001 | Murata et al. | 381/361 |
| 7,054,458 | B2 * | 5/2006 | Ito et al. | 381/355 |
| 7,280,855 | B2 | 10/2007 | Hawker et al. | |
| 7,561,684 | B2 * | 7/2009 | Tsutaichi et al. | 379/433.01 |

FOREIGN PATENT DOCUMENTS

| | | |
|---|---|---|
| EP | 0856977 | 8/1998 |
| JP | 06078040 | 3/1994 |
| WO | 2006024134 | 3/2006 |

OTHER PUBLICATIONS

Fobel, Oliver—European Patent Office, "Extended European Search Report" for corresponding European Patent Application No. 06112357.6, dated Oct. 23, 2006.

Bordovsky, Michael—Canadian Intellectual Property Office, "Examiner's Requisition" for corresponding Canadian Patent Application No. 2,583,899, dated Mar. 18, 2009, Canada.

Ogilvy Renault, Response to Examiner's Requisition of Mar. 18, 2009, for corresponding Canadian Patent Application No. 2,583,899, dated Apr. 9, 2010, Canada.

* cited by examiner

*Primary Examiner* — Curtis Kuntz
*Assistant Examiner* — Ryan Robinson
(74) *Attorney, Agent, or Firm* — Norton Rose Fulbright Canada LLP

(57) ABSTRACT

A shielded microphone, and method for shielding a microphone, are provided for use in a communications device having a circuit board and a microphone. The microphone is provided in an electromagnetic shield and a resilient separator is provided over the shield. The device housing is stacked over the separator and shield, while the latter are stacked over the circuit board so that the separator and shield, with microphone there under, are sandwiched between the housing and the circuit board. By this sandwiching the separator is loaded onto the shield to drive the shield directly against the circuit board to make an electrical ground connection therewith, the microphone also being electrically connected to the printed circuit board. The resilience of the separator accommodates the variation in the stacking of the components.

21 Claims, 4 Drawing Sheets ial connection between the electromagnetic shield and the circuit board have been addressed by placing a conductive gasket between the shield and the circuit board, with such gasket being sufficiently compliant to absorb the stack pressure and required assembly tolerances and the its conductivity providing an electrical connection between the shield and the circuit board. However, those gaskets are relatively expensive and their placement is critical and, thus, poses greater difficult during assembly of the device, since they function as an intermediary component between the shield and the circuit board to establish the electrical connection between them.

SHIELDED MICROPHONE FOR MOBILE COMMUNICATIONS DEVICE

CROSS-REFERENCE TO RELATED APPLICATIONS

This application is a continuation of U.S. patent application Ser. No. 12/399,497 filed Apr. 7, 2006, the disclosure of which is incorporated herein by reference in its entirety.

Note: A portion of the disclosure of this patent document contains material which is subject to copyright protection. The copyright owner has no objection to the facsimile reproduction of any one of the patent document or patent disclosure, as it appears in the Patent and Trademark Office patent file or records, but otherwise reserves all copyright rights whatsoever.

BACKGROUND

Mobile, handheld communications devices typically contain a miniature microphone such as an electret condenser microphone. In such devices, the microphone is typically held against a printed circuit board and electrically connects to the circuit board via a pair of small coil springs. Such devices also typically have an antenna in close proximity to the microphone with the attendant possibility that the microphone can undesirably pick up, as noise, electromagnetic energy radiated by the antenna. In the case of mobile telephones, this undesirable noise is sometimes referred to in the industry as "GSM buzz". To shield the microphone against such noise pick-up, a grounded shield (hereinafter alternatively referred to as an "electromagnetic shield") is typically used to surround or enclose the microphone so as to isolate the microphone, electromagnetically, from such radiation.

In the typical mass production of handheld, mobile communications devices, a number of parts are stacked together and enclosed in a housing. The stack of parts must, when fully assembled, occupy the space defined by the housing of the device. The variability in the size of the parts in the stack and their proper placement during assembly requires that tolerances be factored into the design of the stack of parts. The pressure between the various parts in the stack ultimately depends upon the aggregate size of the parts made to occupy the well-defined space. As excess pressure between the parts may cause undesirable strain and damage thereto, resilient parts capable of absorbing the stack pressure are typically included. Furthermore, in assembling such devices, it is important that the method of mounting the microphone and the electromagnetic shield onto the circuit board be able to accommodate the tolerances of assembly while, at the same time, ensure that an effective electrical connection is made, as required, between the circuit board and each of the microphone and electromagnetic shield.

The problem of providing for both the tolerances of assembly and electrical connection between the electromagnetic shield and circuit board have been addressed by placing a conductive gasket between the shield and the circuit board, with such gasket being sufficiently compliant to absorb the stack pressure and required assembly tolerances and the its conductivity providing an electrical connection between the shield and the circuit board. However, those gaskets are relatively expensive and their placement is critical and, thus, poses greater difficult during assembly of the device, since they function as an intermediary component between the shield and the circuit board to establish the electrical connection between them.

There is, therefore, a need, in a communications device having a microphone and an antenna in close proximity, for a shield assembly which both protects the microphone against energy radiated by the antenna and is able to economically achieve the necessary electrical connections that withstand manufacturing tolerances.

BRIEF DESCRIPTION OF THE DRAWINGS

An understanding of exemplary embodiments of the invention will be obtained from the following description, with reference to the following drawings in which like reference numerals refer to like components throughout.

DETAILED DESCRIPTION

Figure 1:
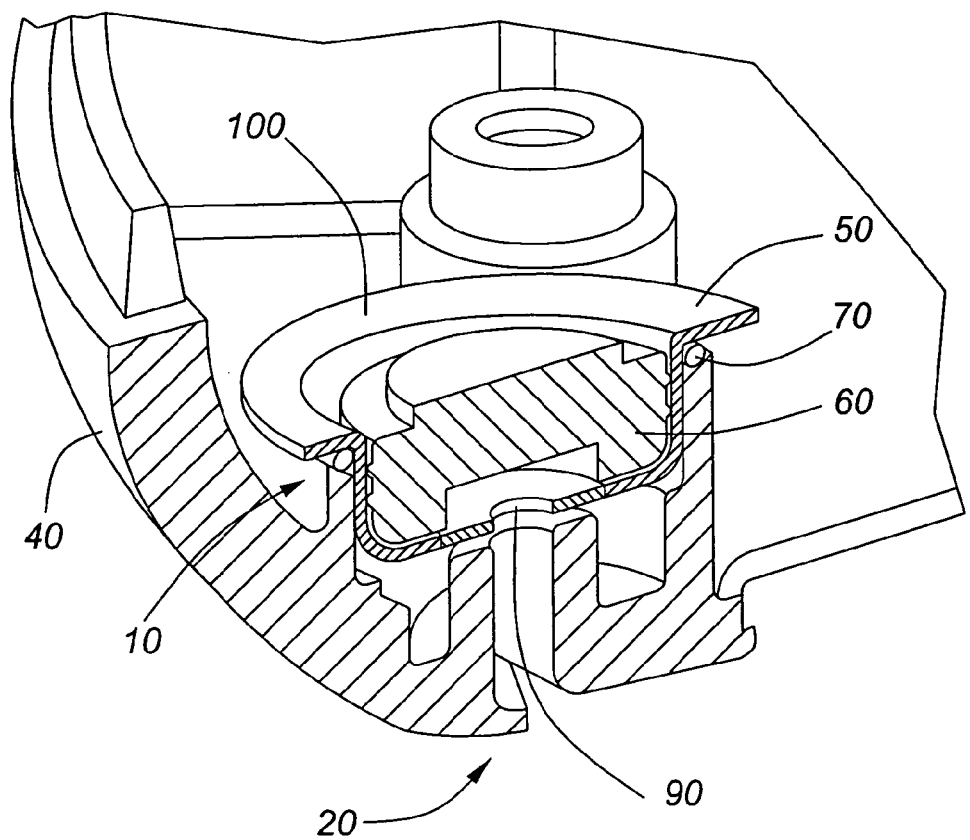
FIG. 1 shows a cross-sectional, pictorial perspective view of an exemplary shielded microphone assembly in accordance with one such embodiment (of which the circuit board has been omitted to better show the remaining components)

In accordance with an aspect of the invention, a shielded microphone assembly is provided for use in a communications device having a circuit board and a housing and having an antenna or used proximate to an antenna. The microphone is placed inside a conductive, electromagnetic shield (e.g. a shielding can) and a separator (e.g. an o-ring-type) is placed over the shield, forming an assembly configured to co-operate with the housing and the circuit board to electrically connect each of the microphone and the electromagnetic shield to the circuit board. The device housing can then be stacked over the assembly, namely, over the shield to load the separator onto the shield and drive the shield directly against the circuit board, whereby the shield becomes grounded through an electrical connection with the circuit board. As a result, the microphone is enclosed between the circuit board and the electromagnetic shield, and is shielded against electromagnetic energy radiated by the nearby antenna. Since the separator is resilient it accommodates the variation in the stack of parts. The electromagnetic shield, when formed as a shielding can, may have a lip whereby the shielding can electrically connects to the circuit board by means of the lip. The separator (preferably an electrical insulator), when formed as a resilient o-ring, preferably surrounds an outside perimeter of the shielding can over the lip. Or, the separator, when formed as a resilient disk, is preferably positioned over a ceiling of the shielding can, where the ceiling is configured to be positioned adjacent the housing upon the loading of the housing. The electromagnetic shield may include an outlet for communication of sound waves to the microphone.

A further aspect of the invention provides a mobile communications device comprising an antenna and a shielded microphone assembly according to the foregoing.

A still further aspect of the invention provides a method of shielding a microphone in such a communications device whereby the microphone is shielded with a conductive, electromagnetic shield; a resilient separator is provided over the electromagnetic shield; and, the shielded microphone and separator are sandwiched between the housing and the circuit board. The shielded microphone and separator are configured to co-operate with the housing and the circuit board to electrically connect each of the microphone and the electromagnetic shield to the circuit board, thereby grounding the electromagnetic shield. The sandwiching produces a loading of the housing onto the separator and the electromagnetic shield onto the circuit board, thereby enclosing the microphone between the circuit board and the electromagnetic shield.

The foregoing disadvantages of the known shielded microphone assemblies can be overcome by using a shielded microphone as described herein and illustrated by FIGS. 1-4. As shown for the embodiment illustrated by FIGS. 1 and 2, the shielded microphone assembly 10 can be used in any suitable communications device 20 having a circuit board 30 (see FIG. 2), which may be a printed circuit board, a housing 40 and, in a mobile communications device, an antenna (not shown). The shielded microphone assembly 10 has an electromagnetic shield in the form of a shielding can 50, a microphone 60 and a separator 70. The shielding can 50 is composed of a conductive material and is grounded through an electrical connection with an electrical ground contact of the circuit board 30. The shielding can 50 and the circuit board 30, when in contact, define an enclosure 80. The microphone 60 is contained within the enclosure 80 and when installed in a communications device is electrically connected with the circuit board 30. The shielding can 50 and the microphone 60 may be any suitable shape such that the microphone 60 fits within the enclosure; accordingly, the cross-sectional shape of the shielding can 50 may be circular, square, hexagonal or any other suitable shape which co-operates with the shape of the microphone and circuit board. The microphone 60 may be held against the circuit board 30 by the shielding can 50; alternatively, the microphone 60 may be soldered or otherwise affixed to the circuit board 30.

The shielding can 50 includes an outlet 90 or other means for communicating sound waves into the shielding can 50 and, thence, to the microphone 60. The separator 70, which is made of a resilient material and may also be insulating (e.g. rubber), is positioned between the shielding can 50 and the housing 40. In this manner, the shielding can 50 shields the enclosed microphone 60 from electromagnetic energy, including electromagnetic energy from a proximate antenna, while the separator 70, being resilient, is springy and able to rebound from, and absorb, pressure between the housing 40 and the shielding can 50.

Figure 2:
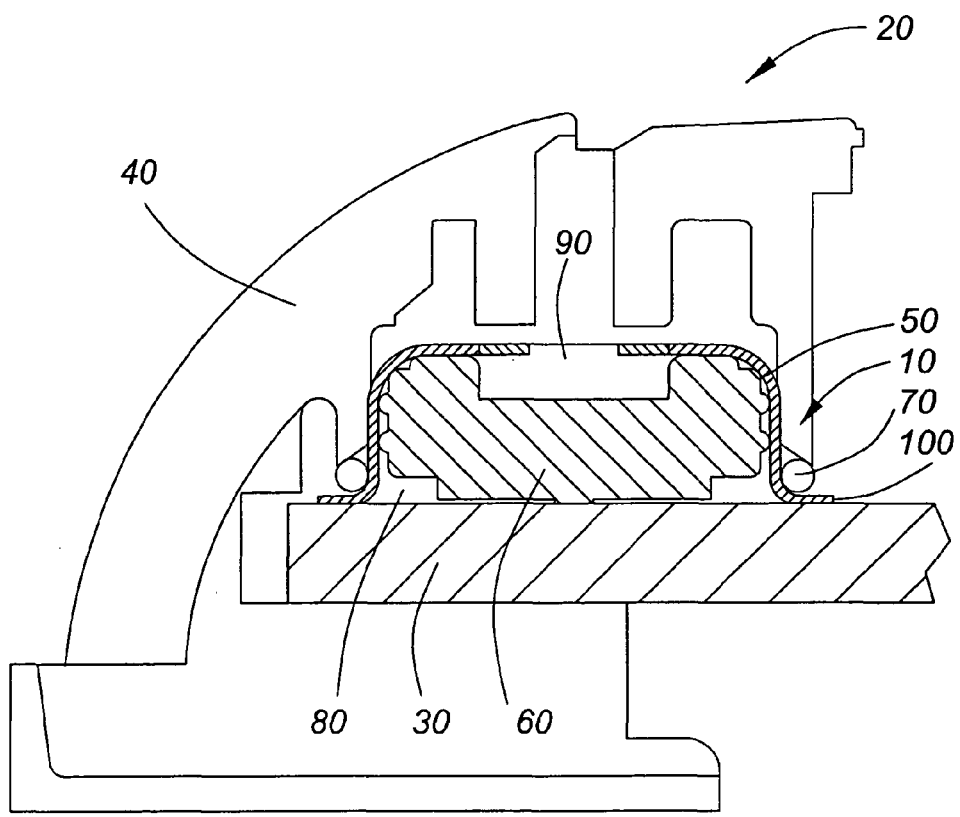
FIG. 2 shows a cross-sectional, pictorial plan view of the embodiment of FIG. 1 in which an o-ring-type separator is used.

In the exemplary embodiment of FIGS. 1 and 2, the separator 70 is an o-ring-type separator positioned over the shielding can 50 and apart from the circuit board 30, so as to surround the outside perimeter of the shielding can 50. The shielding can 50 of this embodiment includes a lip 100 over which the separator 70 is positioned such that, when installed in a communications device by stacking these components with the housing 40 positioned there over and the circuit board 30 positioned there under, the lip 100 of the shielding can 50 is pressed into electrical contact with the circuit board 30. By this stacking, the separator 70 is sandwiched between the housing 40 and the lip 100, and the lip 100 is sandwiched between the separator 70 and the circuit board 30.

Figure 3:
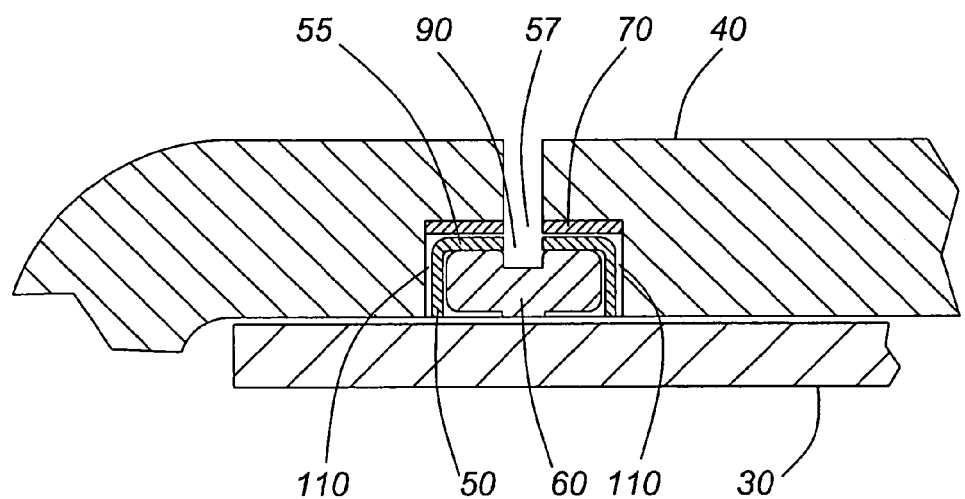
FIG. 3 shows a cross-sectional, pictorial, plan view of another exemplary embodiment of the microphone assembly in which a gasket-type separator is used; and, FIG. 4 shows a flowchart illustrating steps of a method in accordance with another aspect of the invention for assembling a shielded microphone for mounting onto a circuit board.

Alternatively, as shown in FIG. 3, the separator 70 may be a resilient disk positioned over a shielding can 50 which does not include such a lip. In this embodiment, the ceiling (top) 55 of the shielding can 50 parallel to the housing 40 is sandwiched between the disk separator 70 and the circuit board 30. As shown for this embodiment, the disk separator 70 is aligned over the shielding can 50 by means of an appropriately sized channel 110 formed in the housing 40. Further, the disk separator 70 may include a central aperture 57, as shown, aligned in the stack with the counterpart outlet 90 of the ceiling of the shielding can 50 for communication of sound waves to the microphone 60.

Figure 4:
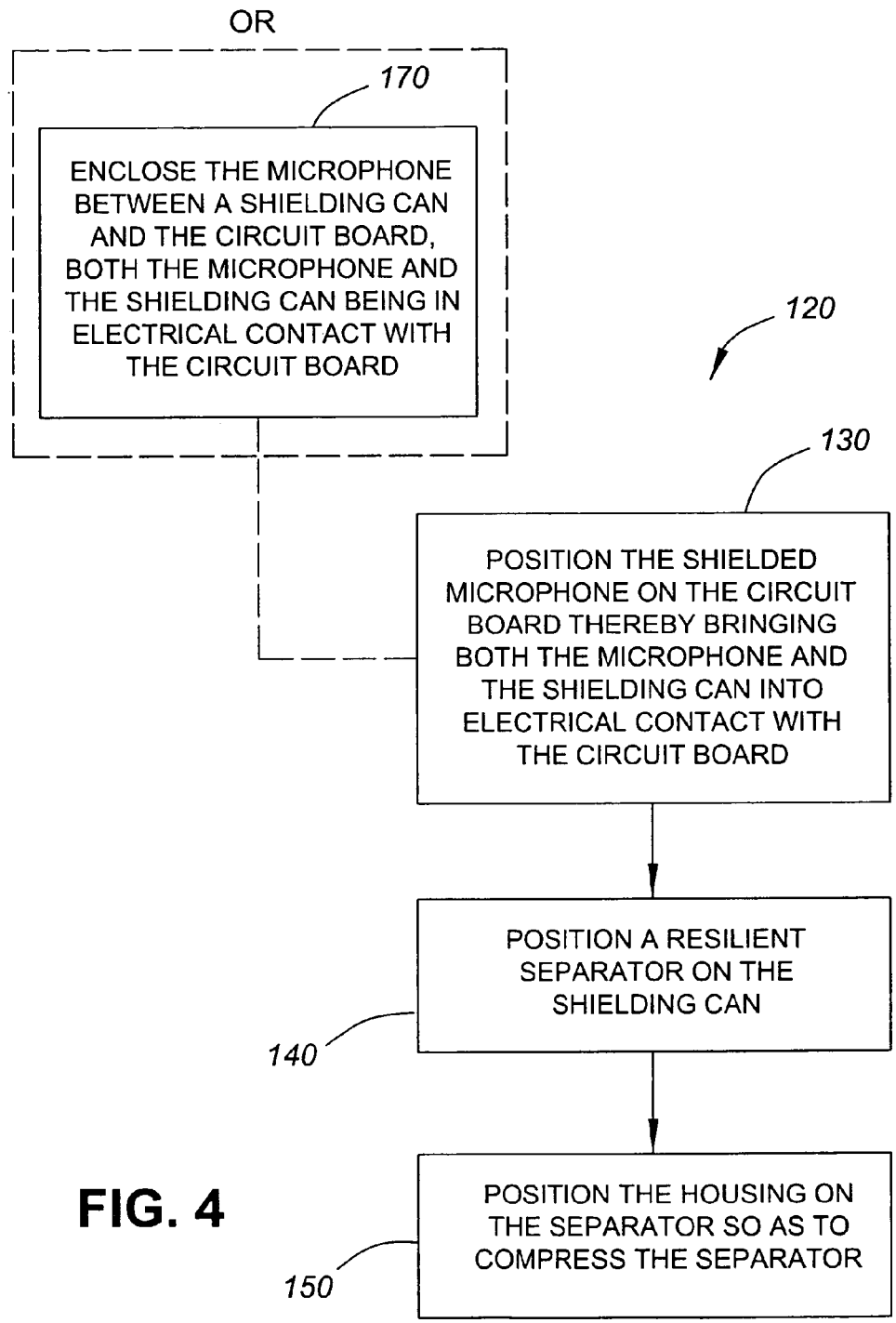

The challenges associated with the known methods of assembling a shielded microphone, as discussed above, are overcome by using the method described herein and illustrated by the flowchart of FIG. 4. The method 120 can be used for the production of any suitable communications device having a circuit board, which may be a printed circuit board, a housing and, for mobiles devices, an antenna. The method 120 is used for assembling a shielded microphone 10 and mounting it onto a circuit board 30, wherein the shielded microphone assembly includes a shielding can 50 and a microphone 60. As described above, the shielding can 50 includes means for communicating sound waves into the shielding can 50 to the microphone 60.

The shielding can 50 and the microphone 60 are mounted together, the microphone being placed within the shielding can, and positioned 130 on the circuit board 30 so that both the microphone and shielding are in electrical contact with the circuit board 30. A resilient separator 70 is positioned 140 over the shielding can 50. The housing 40 is stacked over and pressed onto 150 the separator 70 so as to load the separator 70, sandwiching it between the housing 40 and the shielding can 50. In turn, the shielding can 50 is pressed against the circuit board 30, whereby the shielded microphone assembly becomes mounted on the circuit board 30. The resilience of the separator 70 enables it to absorb (tolerate) the load placed on it by this stacking of the housing 40 onto the shielding can 50 and circuit board 30 there under.

Alternatively, as illustrated in FIG. 4 by step 170 shown in dotted outline to indicate that it replaces the foregoing step 130 for this alternative, the microphone 60 of the shielded microphone assembly may first be mounted onto the circuit board 30 (e.g. by soldering), followed by mounting of the shielding can 50 onto the circuit board 30 so as to cover the microphone 60.

As compared to the solutions known heretofore, the solutions described herein facilitate the manufacturing of such devices while at the same time reducing the overall cost of parts.

With the foregoing exemplary embodiments having been disclosed, it will be apparent to those skilled in the art that various changes and modifications can be made to appropriately suit the needs and objectives of another application and still achieve the advantages of the invention; all such changes and modifications are intended to fall within the scope of the invention as defined by the claims that follow.

The invention claimed is:

1. A microphone shielding assembly for use in a communications device, the assembly comprising:
   a conductive shield configured to cooperate with a circuit board of the device to enclose a microphone of the device; and
   a resilient separator positioned to be compressed between the conductive shield and a housing of the device, the separator providing electrical insulation between the conductive shield and the housing;
   wherein the separator and the shield are configured to cause electrical contact between the circuit board and each of the conductive shield and the microphone, when the housing is positioned to house the assembly and the microphone is enclosed between the circuit board and the conductive shield.

2. The assembly according to claim 1, wherein the separator is configured to be compressed between a substantially planar surface of the conductive shield and the housing, when the housing is positioned to house the assembly.

3. The assembly according to claim 1, wherein the separator is configured to be compressed between an outside perimeter of the conductive shield and the housing, when the housing is positioned to house the assembly.

4. The assembly according to claim 1, wherein the conductive shield is formed as a shielding can having a lip, the shielding can configured to cause the electrical contact between the conductive shield and the circuit board by means of the lip.

5. The assembly according to claim 4, wherein the separator is configured to substantially surround an outside perimeter of the shielding can over the lip.

6. The assembly according to claim 1, wherein the conductive shield is formed as a shielding can having a ceiling surface, and the separator is positioned between the ceiling of the shielding can and the housing, when the housing is positioned to house the assembly.

7. The assembly according to claim 6, wherein the separator is positioned between the shielding can and the housing, when the housing is positioned to house the assembly, by means of a channel formed in the housing.

8. The assembly according to claim 1, wherein the conductive shield includes an outlet for communication of sound waves to the microphone.

9. A mobile communications device comprising the assembly in accordance with claim 1.

10. A method of shielding a microphone in a communications device, the method comprising:
   enclosing the microphone between a conductive shield and a circuit board; positioning a resilient separator to be compressed between the conductive shield and a housing of the device, the separator providing electrical insulation between the conductive shield and the housing; and
   positioning the housing to house the conductive shield and the separator;
   wherein the separator and the shield are configured to cause electrical contact between the circuit board and each of the conductive shield and the microphone, when the housing is positioned to house the conductive shield and the separator and the microphone is enclosed between the circuit board and the conductive shield.

11. The method according to claim 10, wherein the separator is configured to be compressed between a substantially planar surface of the conductive shield and the housing, when the housing is positioned to house the conductive shield and the separator.

12. The method according to claim 10, wherein the separator is configured to be compressed between an outside perimeter of the conductive shield and the housing, when the housing is positioned to house the conductive shield and the separator.

13. The method according to claim 10, wherein the conductive shield is formed as a shielding can having a lip, the shielding can configured to cause the electrical contact between the conductive shield and the circuit board by means of the lip.

14. The method according to claim 13, wherein the separator is configured to substantially surround an outside perimeter of the shielding can over the lip.

15. The method according to claim 10, wherein the conductive shield is formed as a shielding can having a ceiling surface, and the separator is positioned between the ceiling of the shielding can and the housing, when the housing is positioned to house the conductive shield and the separator.

16. The method according to claim 15, wherein the separator is positioned between the shielding can and the housing, when the housing is positioned to house the conductive shield and the separator, by means of a channel formed in the housing.

17. The method according to claim 10, wherein the conductive shield includes an outlet for communication of sound waves to the microphone.

18. The method according to claim 10, wherein the microphone is fixed to the circuit board.

19. The method according to claim 10, wherein the microphone is held against the circuit board by the conductive shield, when the housing is positioned to house the conductive shield and the separator.

20. The assembly according to claim 1, wherein the microphone is in direct contact with the circuit board.

21. The assembly according to claim 1, wherein the microphone includes a central upraised part that is in direct contact with the circuit board, and the conductive shield includes a top, which directly contacts the separator, and a side, which is spaced from the housing.

* * * * *